United States Patent [19]
Narayan et al.

[11] Patent Number: 6,008,523
[45] Date of Patent: Dec. 28, 1999

[54] ELECTRICAL FUSES WITH TIGHT PITCHES AND METHOD OF FABRICATION IN SEMICONDUCTORS

[75] Inventors: Chandrasekhar Narayan, Hopewell Junction; Axel Brintzinger, Fishkill; Gabriel Daniel, Jamaica Estates; Fred Einspruch, Sparrowbush, all of N.Y.

[73] Assignees: Siemens Aktiengesellschaft, Munich, Germany; International Business Machines Corporation, Armonk, N.Y.

[21] Appl. No.: 09/140,573

[22] Filed: Aug. 26, 1998

[51] Int. Cl.$^6$ .................................................. H01L 29/00
[52] U.S. Cl. ............................................. 257/529; 257/209
[58] Field of Search .................................... 257/209, 529; 365/185.09, 200

[56] References Cited

U.S. PATENT DOCUMENTS

| | | | |
|---|---|---|---|
| 4,635,345 | 1/1987 | Hankins et al. | 29/577 C |
| 4,984,054 | 1/1991 | Yamada et al. | 257/529 |
| 5,313,424 | 5/1994 | Adams et al. | 365/200 |
| 5,420,456 | 5/1995 | Galbi et al. | 257/529 |
| 5,436,496 | 7/1995 | Jerome et al. | 257/529 |
| 5,661,331 | 8/1997 | Hebbeker et al. | 257/529 |
| 5,747,868 | 5/1998 | Reddy et al. | 257/529 |
| 5,844,296 | 12/1998 | Murray et al. | 257/529 |

FOREIGN PATENT DOCUMENTS

3-124047  5/1991  Japan.

*Primary Examiner*—Mahshid Saadat
*Assistant Examiner*—George C. Eckert
*Attorney, Agent, or Firm*—Stanton C. Braden

[57] ABSTRACT

A semiconductor device includes an array of electrical fuses having a structure which permits tight fuse pitches while enabling electrical fusing at voltages of about 10 volts or less. The fuses are useful to replace defective components of the device and/or to permit custom wiring. The semiconductor device includes a substrate with a tight pitch array of fuses including a plurality of fuse links of selective cross sectional area in closely adjacent arrangement, each connected at one end to an individual connector terminal of larger cross sectional area than that of the fuse link, and at another end to a common connector terminal of larger cross sectional area than that of the individual connector terminals. The common connector terminal is typically held at a less positive potential than one of the individual connector terminals during the time a fuse link thereat is to be opened such that electron flow is in a direction from the common connector terminal to the fuse link. The common connector terminal cross sectional area is desirably about 2 or more times that of the individual fuse links to enable electrical fusing at voltages of about 10 volts or less.

17 Claims, 4 Drawing Sheets

ELECTRICAL FUSES WITH TIGHT PITCHES AND METHOD OF FABRICATION IN SEMICONDUCTORS

FIELD OF THE INVENTION

This invention relates to electrically activated fuses having tight pitches which are well suited for use in semiconductors, and more particularly, to an optimized electrical fuse design and method of fabrication permitting tight fuse pitches in semiconductor devices while enabling electrical fusing at voltages below about 10 volts, such as during fusing operation of redundancy activation or custom wiring, i.e., without compromising desired pitch reduction.

BACKGROUND OF THE INVENTION

In fabricating microelectronic semiconductor devices on a wafer substrate or chip, such as of silicon, to form an integrated circuit (IC), various metal layers and insulation layers are deposited in selective sequence. To maximize integration of device components in the available substrate area to fit more components in the same area, increased IC miniaturization is utilized. Reduced pitch dimensions are needed for denser packing of components per present day very large scale integration (VLSI), e.g., at sub-micron (below 1 micron, i.e., 1,000 nanometer or 10,000 angstrom) dimensions.

Redundancy techniques are used in semiconductor fabrication to provide deliberate duplication of circuit components to decrease the probability of a circuit failure and thus increase circuit reliability. To offset defects that can occur in the circuitry, multiple copies of a given circuit component are connected in parallel to achieve continued operation upon failure of a particular component. Each such multiple component is provided with a set of fuses that can be blown to replace a failed component by a duplicate one during fusing operation of redundancy activation, e.g., at final IC chip testing.

Some ICs have conductive links between semiconductor devices that are coupled to fuses that can be laser cut (blown) after fabrication. Thus, in a dynamic random access memory (DRAM) circuit, fuses can protect transistor gate stacks from destruction due to inadvertent build-up charges. After IC fabrication, the fuses can be blown to permit the DRAM circuit to function as if the protective current paths never existed.

Also, fuses are used to set the enable bit and the address bits of a redundant array element in a DRAM circuit. To replace a defective main memory array element within a main memory array, a redundant array is provided which has a plurality of fuses in a fuse array coupled thereto via a fuse latch array and a fuse decoder array. In replacing a defective main memory array element, individual fuses in the fuse array are blown to set their values to either a "1" or a "0" required by the decoder circuit. During operation, the values of the fuses in the fuse array are loaded into the fuse latch array upon power up, and these values then decoded by the fuse decoder circuit during run time. This facilitates replacement of specific failed main memory array elements by specific redundant elements of the redundant array, all by well known techniques.

In particular, high density DRAMs are commonly designed with memory cell redundancy whereby the redundant memory cells avoid loss of an entire memory in the event that a minor number of memory cells fail to function. Redundant memory cell activation is effected by blowing fuses selectively placed throughout the memory. Blowing a set of fuses disables the defective memory cell and enables in its place a redundant memory cell.

Fuses may also be incorporated in an IC of a semiconductor device module adapted for custom wiring operation, depending on the requirements of the end user. By blowing selective fuses in the circuit, the semiconductor device module can be customized for particular purposes.

Fuse blowing is effected by heating the fuse to melt it and create an open circuit, e.g., to replace a defective memory cell or other component by a functional cell or different component. The fuse is usually of aluminum, copper or other highly conductive metal or metal alloy, and has a central portion or fuse segment (fuse link) of smaller cross sectional area than its ends (connector terminals) to reduce the energy needed to melt the fuse and create an open circuit condition.

The melting (blowing) of fuses can be effected by a laser beam with a controlled beam width. This can result in laser-induced damage to the area beneath the fuse link, mainly due to absorption of laser energy. Alternatively, electrical fuses can be blown by applying a high current thereto for heating the fuse link by electrical power without such damage.

To enable electrical fusing with voltages below about 10 volts in semiconductor devices, it is important that the cross sectional area reduction from the connector terminals to the electrical fuse segment (fuse link) be as large as possible, preferably greater than 5 or 10. However, the need for such large connector terminals limits the proximity of neighboring fuses.

The voltage necessary to activate an electrical fuse is very sensitive to the geometry of the fuse. The shape of the fuse, its linearity, and the size of the connector terminals all impact the voltage needed to blow the fuse. It is, therefore, important that the fuse geometry be optimized.

An electrical fuse is basically an expendable overcurrent protective device having a circuit-opening fusible (meltable) conductive, e.g., metal or metallic material, fuse segment (fuse link) heated and destroyed by passing an overcurrent through it. The overcurrent heats the fuse link beyond the normal level of radiation loss of the generated resistance heat that keeps its temperature below that at which it melts. The fuse link resistance is particularly determined by the material of which it is made, its cross sectional area, its length, and its temperature.

Like any electrically conductive wire (and apart from the material of which it is made and its temperature), if the length of a fuse link or connector terminal is doubled, its resistance is also doubled, whereas if its cross sectional area is doubled, its resistance is halved. In short, the resistance of a fuse link or connector terminal is directly proportional to its length and inversely proportional to its cross sectional area.

Some examples of the fabrication of semiconductor devices with fuse arrangements are shown in the following prior art.

[1] U.S. Pat. No. 4,635,345 (Hankins et al.), issued Jan. 13, 1987, discloses vertical (three-dimensional), as opposed to horizontal (two-dimensional), fuses in an IC memory array to increase the component density on a substrate in a semiconductor device. A thin oxide fusible element (fuse link) is provided between the emitter region of a bipolar resistor, which emitter forms a bottom electrode (bottom connector terminal), and a top electrode (top connector terminal), e.g., of aluminum. Applying a voltage, e.g., of 12–14 volts, between the top electrode and emitter blows the thin oxide fuse, causing the top electrode to come into contact with the emitter. This is also referred to as anti-fuse.

[2] U.S. Pat. No. 5,436,496 (Jerome et al.), issued Jul. 25, 1995, discloses an array of vertical fuses in an IC to increase the substrate component density in a semiconductor device. Each fuse is selectively permanently programmable after fabrication and the fuse structure includes a buried collector, an overlying base and an emitter above the base and having a metal contact, e.g., of aluminum, at its upper surface. Heating the metal contact/emitter interface to its melting point by a current or voltage pulse causes the aluminum to short through the emitter to the base, thereby programming the fuse. The vertical fuse functionally changes from a floating base transistor to a diode.

[3] Japanese Patent Document JA 403124047 (Saito) of May, 1991, per English Abstract, discloses a polycrystalline silicon fuse link in a vertical U-shaped arrangement in an IC on a substrate to increase the fuse length within a confined substrate area in a semiconductor device.

[4] U.S. Pat. No. 5,313,424 (Adams et al.), issued May 17, 1994, discloses a semiconductor substrate having an electrically blown fuse circuit based on anti-fuse technology. A resistance decrease, e.g., of only 50%, due to dopant redistribution, is exhibited on "blowing" a given fuse. A redundancy system includes circuits to test a memory array to locate a faulty element therein, a resistor to store an address of the faulty element and electrical fuses blown in response to binary digits of the address stored in the register on applying an enable signal from a single input to the semiconductor device. Programmable redundancy is provided by sensing resistance decreases due to dopant redistribution, e.g., in a polysilicon fuse link, in a programmable anti-fuse circuit.

[5] U.S. Pat. No. 5,420,456 (Galbi et al.), issued May 30, 1995, discloses a fuse link with a bend to reduce the power needed for driver transistors to blow the fuse to implement redundancy activation wiring or custom wiring in an IC on a substrate during semiconductor fabrication. Using stated blow control circuitry, the fuse can be blown with only about 10% of the input current density needed for a straight fuse of equal cross sectional area. This is due to current crowding at the bend inside corner which accentuates the current density and thus causes melting at the inside corner. This is enhanced by melt notching which occurs at the bend and causes the fuse link melting to propagate across the fuse link width. The contents of this patent are incorporated herein by reference.

It is known that the shape of an electrical fuse used in a semiconductor device can be changed to lower the voltage needed to blow the fuse. The fuse generally has a pair of connector terminals interconnected by a central fuse link. The fuse can have connector terminals of minimum fuse pitch cross sectional area and a fuse link of reduced cross sectional area to promote some differential resistance heating and some preferential melting of the fuse link.

Secondly, e.g., as noted in said [5] U.S. Pat. No. 5,420,456 (Galbi et al.), issued May 30, 1995, the reduced cross sectional area fuse link of the minimum fuse pitch connector terminal arrangement can be bent to promote even more local preferential melting thereat.

Thirdly, the cross sectional area of the connector terminals can be increased above the minimum fuse pitch to maximize the difference between the cross sectional area of the connector terminals and that of the fuse link to promote maximized differential resistance heating and maximized preferential melting of the fuse link. However, this maximized preferential melting of the fuse link occurs at the expense of the fuse pitch in the semiconductor device circuit because the increase in cross sectional area of the connector terminals limits the closeness of adjacent fuses in the given circuit arrangement.

It is desirable to have a redundancy activation circuit arrangement or other circuit arrangement with fuses of optimum geometry that enable electrical fusing at voltages of at most about 10 volts, and preferably below 10 volts, without limiting the proximity of a given fuse to neighboring fuses or compromising the desired maximum pitch reduction between adjacent fuses.

SUMMARY OF THE INVENTION

The foregoing drawbacks are obviated in accordance with the present invention by providing a semiconductor device with an electrical fuse construction permitting tight fuse pitches, and a method for its fabrication.

According to one aspect of the invention, a semiconductor device is provided which comprises a substrate having on a surface thereof an array of fuses including a plurality of fuse links of selective cross sectional area in closely adjacent arrangement. Each fuse link is connected at one end to an individual connector terminal of larger cross sectional area than that of the fuse link, and at another end to a common connector terminal of larger cross sectional area than that of the individual connector terminals.

The cross sectional area of the common connector terminal is suitably at least about 2 times that of the individual fuse links to enable electrical fusing at voltages of at most about 10 volts. The common connector terminal is typically held at a less positive potential than one of the individual connector terminals during the time a fuse link thereat is to be opened such that electron flow is in a direction from the common connector terminal to the fuse link. Also, the common connector terminal is preferably locally notched at the point of connection of each fuse link thereto.

In particular, the semiconductor device further includes a plurality of layers of insulation material such that the array of fuses is encapsulated between two layers of insulation material of the plurality of layers of insulation material. One of the two layers is disposed in underlying relation to the array of fuses and the other of the two layers is disposed in overlying relation to the array of fuses. Electrical contacts are formed in respective openings of the layer of insulation material in overlying relation to the array of fuses, which openings correspondingly expose portions of the individual connector terminals and common connector terminal.

According to a preferred embodiment of the invention, the semiconductor device comprises a substrate having on a surface thereof a bank of electrical fuses in a tight pitch array for redundancy activation wiring or custom wiring, including a plurality of fuse links each connected at one end to an individual connector terminal of larger cross sectional area than that of the fuse link and at another end to a common connector terminal of larger cross sectional area than that of the individual connector terminals. The common connector terminal is typically held at a less positive potential than one of the individual connector terminals during the time a fuse link threat is to be opened such that electron flow is in a direction from the common connector terminal to the fuse link.

In particular, the semiconductor device comprises a substrate having on a surface thereof a tight pitch array of redundancy activation wiring or custom wiring fuses including a plurality of individual connector terminals of selective cross sectional area, each extending longitudinally from a distal end thereof to a medial end thereof and being in closely adjacent side by side arrangement. A fuse link extends from the medial end of each individual connector terminal and is of smaller cross sectional area than that of the individual connector terminals. A common connector terminal of larger cross sectional area than that of each individual connector terminal is provided which extends crosswise of the side by side arrangement of the individual connector termninals and is connected along its length to each adjacent fuse link.

From another aspect, the present invention is directed to an array of fuses on a surface of a substrate of a semiconductor device including a plurality of fuse links of selective cross sectional area in closely adjacent arrangement, each being connected at one end thereof to an individual connector terminal of larger cross sectional area than that of the fuse link, and being connected at another end thereof to a common connector terminal of larger cross sectional area than that of the individual connector terminals.

According to another aspect of the invention, a method of fabricating a semiconductor device is provided for achieving an arrangement of redundancy activation wiring or custom wiring fuses. The method comprises the steps of providing a first insulation layer on a surface of a substrate, providing an array of fuses on the first insulation layer, and providing a second insulation layer on the first insulation layer and the fuse array sufficiently to encapsulate the fuse array between the first and second insulation layers. The fuse array includes a plurality of fuse links of selective cross sectional area in closely adjacent arrangement, each connected at one end to an individual connector terminal of larger cross sectional area than that of the fuse link, and at another end to a common connector terminal of larger cross sectional area than that of the individual connector terminals.

Further steps include providing respective openings in the second insulation layer to expose correspondingly portions of the individual connector terminals and common connector terminal, and providing electrical contacts in the openings for the individual connector terminals and common connector terminal.

The invention will be more readily understood from the following detailed description taken with the accompanying drawings and claims.

It is noted that the drawings are not to scale, some portions being shown exaggerated to make the drawings easier to understand.

DETAILED DESCRIPTION

Figure 1A:
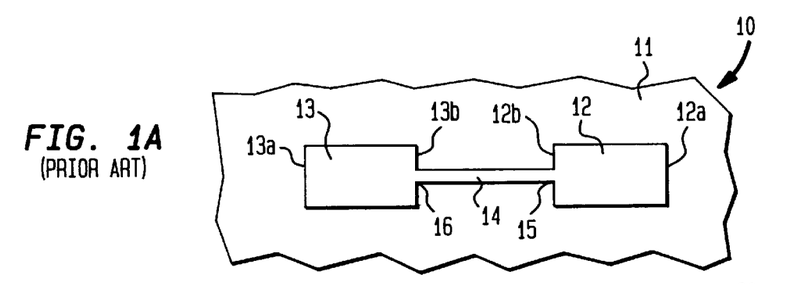
FIGS. 1a, 1b and 1c are top views, respectively illustrating three different prior art forms of electrical fuses, e.g., usable for fusing operation of redundancy activation in a semiconductor device.
Figure 1B:
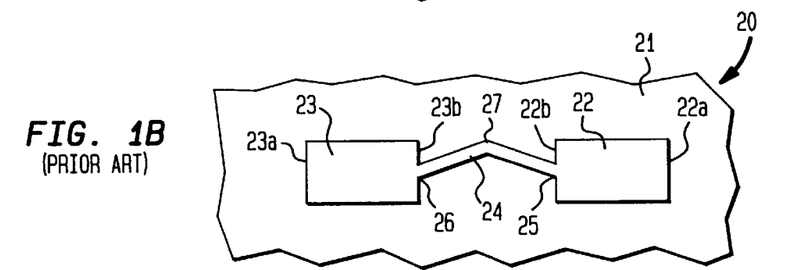
Figure 1C:
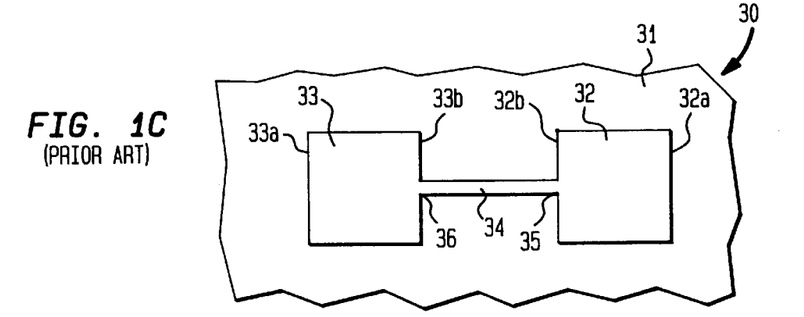

Referring now to FIGS. 1a, 1b and 1c, there are shown three different prior art forms of electrical fuses, e.g., usable for fusing operation of redundancy activation in a semiconductor device. FIG. 1a includes semiconductor device 10, wafer substrate 11, connector terminals 12 and 13, distal ends 12a and 13a, medial ends 12b and 13b, fuse link 14, and connection points 15 and 16. FIG. 1b includes semiconductor device 20, wafer substrate 21, connector terminals 22 and 23, distal ends 22a and 23a, medial ends 22b and 23b, fuse link 24, connection points 25 and 26, and apex portion 27. FIG 1c includes semiconductor device 30, wafer substrate 31, connector terminals 32 and 33, distal ends 32a and 33a, medial ends 32b and 33b, fuse link 34, and connection points 35 and 36.

FIG. 1a shows semiconductor device 10 having a wafer substrate 11, e.g., of silicon, provided with a pair of opposed connector terminals 12 and 13. Connector terminal 12 is connected at distal end 12a to a circuit portion (not shown), and connector terminal 13 is connected at distal end 13a to another circuit portion (not shown). Connector terminals 12 and 13 are interconnected at their facing medial ends 12b and 13b by a central fuse link 14 at connection points 15 and 16. Connector terminals 12 and 13 and fuse link 14 are typically formed of conductive layer material, such as polysilicon, metal silicide, e.g., tungsten silicide, metal, e.g., aluminum or copper, or the like, yet fuse link 14 must be preferentially fusible (meltable).

Fuse link 14 is of reduced cross sectional area compared to the minimal cross sectional area of connector terminals 12 and 13 in order to promote some differential resistance heating between fuse link 14 and connector terminals 12 and 13, and some preferential melting of fuse link 14. Connector terminals 12 and 13 are comparable to a typical electrically conductive wire and are of acceptable size for inclusion of a plurality of such fuses in tight pitch array in a side by side arrangement limited only by the size (width) of conductor terminals 12 and 13.

FIG. 1b shows semiconductor device 20 having a wafer substrate 21 provided with a pair of opposed connector terminals 22 and 23. Connector terminal 22 is connected at distal end 22a to a circuit portion (not shown), and connector terminal 23 is connected at distal end 23a to another circuit portion (not shown). Connector terminals 22 and 23 are interconnected at their facing medial ends 22b and 23b by a central fuse link 24 at connection points 25 and 26.

Semiconductor device 20 of FIG. 1b only differs from semiconductor device 10 of FIG. 1a in that fuse link 24 is provided as a bent (non-uniform) element having an apex portion 27 to promote even more the differential resistance heating between fuse 24 and connector terminals 22 and 23 and especially local preferential melting at apex portion 27 of fuse link 24.

Semiconductor device 20 of FIG. 1b is typified by the bent fuse link construction of said [5] U.S. Pat. No. 5,420,456 (Galbi et al.), issued May 30, 1995.

FIG. 1c shows semiconductor device 30 having a wafer substrate 31 provided with a pair of opposed connector terminals 32 and 33. Connector terminal 32 is connected at distal end 32a to a circuit portion (not shown), and connector terminal 33 is connected at distal end 33a to another circuit portion (not shown). Connector terminals 32 and 33 are interconnected at their facing medial ends 32b and 33b by a central fuse link 34 at connection points 35 and 36.

Semiconductor device 30 of FIG. 1c only differs from semiconductor device 10 of FIG. 1a in that connector terminals 32 and 33 are provided as enlarged elements of pronouncedly increased (maximized) cross sectional area compared to that of fuse link 34 to promote even more (i.e., maximize) the differential resistance heating between fuse 34 and connector terminals 32 and 33 and the preferential melting of fuse link 34.

Increasing the cross sectional area of connector terminals 32 and 33 per FIG. 1c (maximally) above the minimum cross sectional area of connector terminals 12 and 13 per FIG. 1a, promotes maximized differential resistance heating and maximized preferential melting of fuse link 34. This is because there is a practical limit to the degree of size reduction or cross sectional area reduction of the fuse link, and hence any further increase in the cross sectional differential must be in terms of increasing the size or cross sectional area of the connector terminals.

However, as earlier noted, increasing the cross sectional area of the connector terminals, i.e., at the minimum practical cross sectional area achievable for the fuse link, results in an undesirable increase in the fuse pitch beyond the minimum desired fuse pitch in the semiconductor device circuit system. This is because the increased cross sectional area of the connector terminals (see FIG. 1c) limits the closeness of adjacent fuses, e.g., in the redundancy activation circuit arrangement.

As demonstrated below, the prior art drawbacks of the constructions of FIGS. 1a, 1b and 1c are overcome by the system of the present invention, which contemplates use of a redundancy activation circuit arrangement or other circuit arrangement with fuses of optimum geometry. This enables electrical fusing at voltages of at most about 10 volts, and preferably below 10 volts, without limiting the proximity of a given fuse to neighboring fuses or compromising the desired pitch reduction between adjacent fuses.

Figure 2:
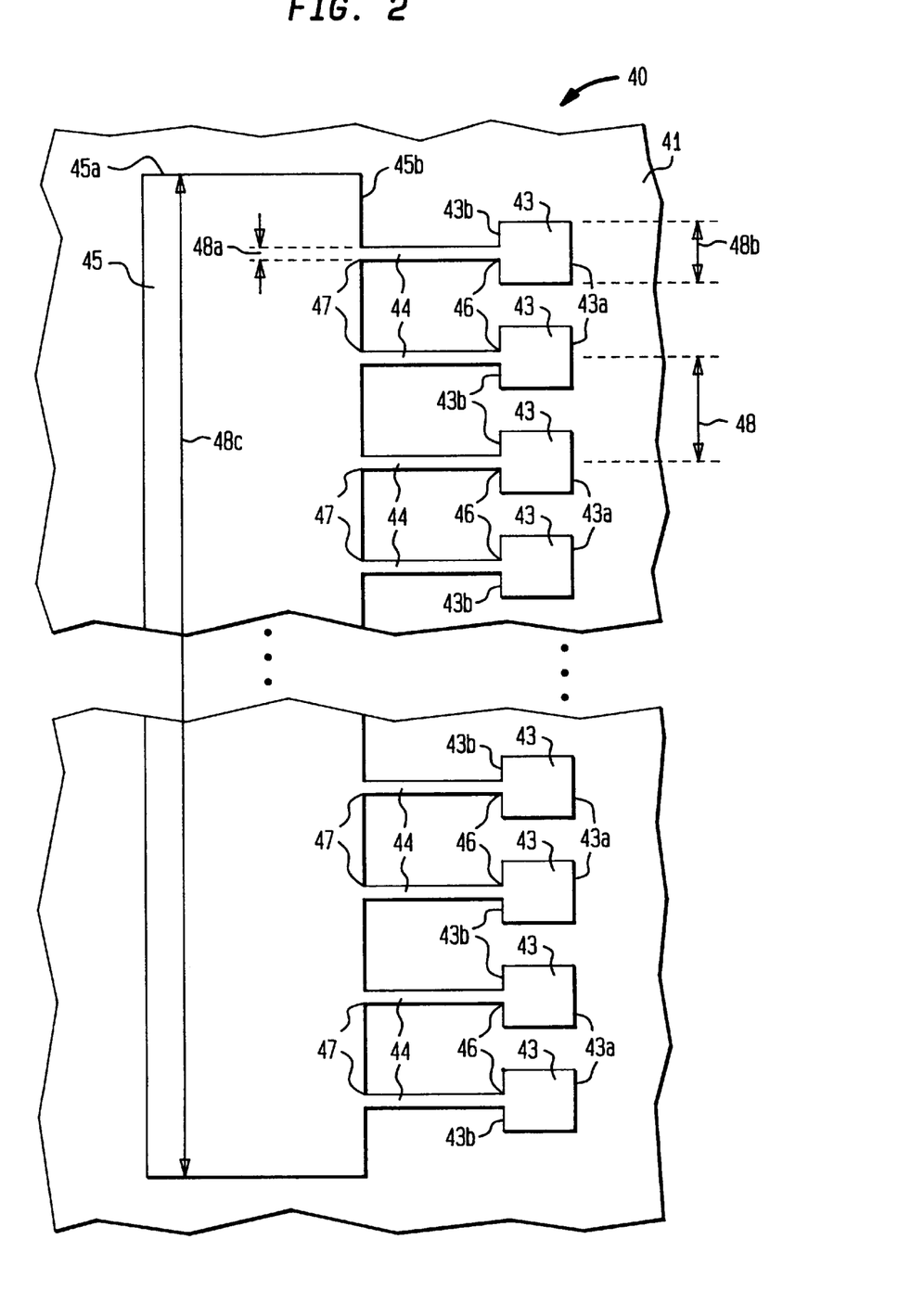
FIG. 2 is a top view of an electrical fuse arrangement, e.g., used for fusing operation of redundancy activation in a semiconductor device, in accordance with an embodiment of the invention.

Referring now to FIG. 2, there is shown an arrangement of electrical fuses according to the invention, usable for fusing operation of redundancy activation in a semiconductor device, e.g., at IC chip final testing, or usable for other purposes. FIG. 2 includes semiconductor device 40, wafer substrate 41, fuse array 42, individual connector terminals 43, distal ends 43a, medial ends 43b, fuse links 44, common connector terminal 45, distal portion 45a, medial portion 45b, connection points 46 and 47, fuse pitch interval 48, and widths 48a, 48b and 48c.

FIG. 2 shows semiconductor device 40 having a wafer substrate 41, e.g., of silicon, provided with a tight pitch array 42 of fuses, e.g., redundancy activation fuses. Array 42 includes a plurality (bank) of unilateral individual connector terminals 43 disposed in closely adjacent side by side arrangement, and connected at their distal ends 43a to a circuit portion (not shown) and at their medial ends 43b to a corresponding plurality of fuse links 44. A single common connector terminal 45 is disposed as a common pad or bus in opposing, e.g., crosswise, relation to individual connector terminals 43, and is connected at distal portion 45a to another circuit portion (not shown) and at and along medial portion 45b to the adjacent bank of fuse links 44. Fuse links 44 interconnect individual connector terminals 43 and common connector terminal 45 at connection points 46 and 47.

Individual connector terminals 43, fuse links 44 and common connector terminal 45 are typically formed of electrically conductive layer material, such as polysilicon, metal silicide, e.g., tungsten silicide, metal, e.g., aluminum or copper, or the like, yet fuse links 44 must be preferentially fusible (meltable). The arrangement of individual connector terminals 43, fuse links 44 and common connector terminal 45 is provided on substrate 41 in conventional manner, e.g., by chemical vapor deposition (CVD) or plasma enhanced CVD (PECVD), such that they extend in thin layer form generally in horizontal (two-dimensional) direction and in coplanar relation to each other and to the surface of wafer substrate 41, being generally parallel to the surface of wafer substrate 41.

Fuse links 44 are of reduced cross sectional area (e.g., bounded by width 48a), compared to the normal (minimized) cross sectional area (e.g., bounded by width 48b) of individual connector terminals 43 to promote some differential resistance heating between fuse links 44 and individual connector terminals 43, and some preferential melting of fuse links 44. More important, common connector terminal 45 is of pronouncedly enlarged (maximized) cross sectional area (e.g., bounded by width 48c, i.e, equal to the running length of the common connector terminal 45), compared to individual connector terminals 43 to promote maximized differential resistance heating between fuse links 44 (bounded by width 48a) and common connector terminal 45 (bounded by width 48c), and maximized preferential melting of fuse links 44.

Individual connector terminals 43 are comparable to a typical electrically conductive wire and are of acceptable minimal size (width) for inclusion of a plurality of such fuses in tight pitch array in a closely adjacent side by side arrangement limited only by the size (width) of the individual conductor terminals 43. On the other hand, since common connector terminal 45 extends crosswise of, e.g., normal to, the side by side, e.g., parallel, arrangement (bank) of individual connector terminals 43, its pronouncedly increased (maximized) operative cross sectional area (e.g., bounded by width 48c compared to width 48a of fuse links 44), is readily accommodated in the allotted surface area of wafer substrate 41. The length of common connector terminal 45 can be matched to the extent in such crosswise direction of the side by side arrangement of individual connector terminals 43. Hence, the desired tight fuse pitch interval 48 (i.e., the distance from the central axis of one individual connector terminal 43 to the next) is not compromised.

The cross sectional area of common connector terminal 45 is desirably at least about 2 times, and preferably at least about 10 times, the cross sectional area of each individual fuse link 44, and especially more than 10 times the cross sectional area of each of the individual fuse links 44, for enabling electrical fusing at voltages of 10 volts or less.

The common connector terminal 45 is typically held at a less positive potential (typically ground potential) than one of the individual connector terminals 43 during the time a fuse link 44 thereat is to be opened such that electron flow is in a direction from the common connector terminal to the fuse link 44. A fuse link 44 is typically opened during redundancy activation wiring or custom wiring fuses, e.g., at final IC chip testing. The bank of individual connector terminals 43 and fuse links 44 typically includes repeated sets of eight individual connector terminals 43 and fuse links 44 (corresponding to eight bits per byte) per usual redundancy activation technique.

Figure 3:
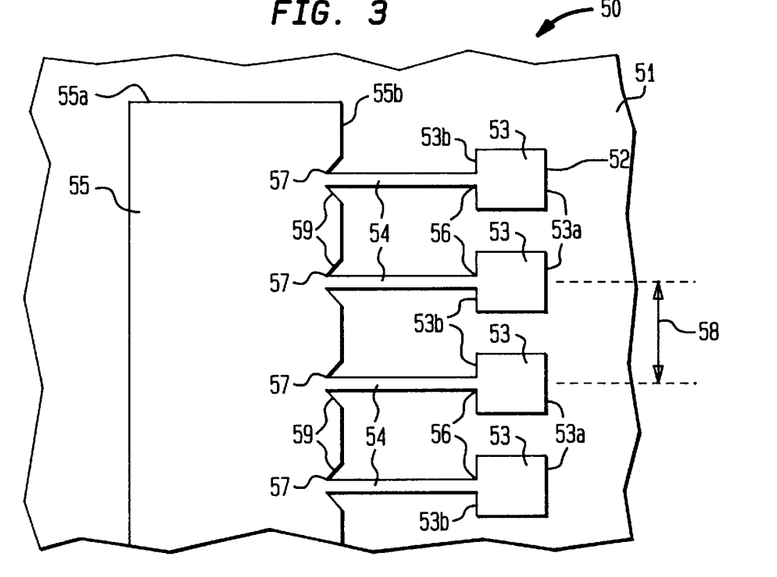
FIG. 3 is a top view of a portion of a notch modified embodiment of the electrical fuse arrangement shown in FIG. 2.

Referring now to FIG. 3, there is shown a portion of a modified arrangement of electrical fuses according to the inventions usable for fusing operation of redundancy activation in a semiconductor device, or for other purposes. FIG. 3 includes semiconductor device 50, wafer substrate 51, fuse array 52, individual connector terminals 53, distal ends 53a, medial ends 53b, fuse links 54, common connector terminal 55, distal portion 55a, medial portion 55b, connection points 56 and 57, fuse pitch interval 58, and notched portions 59.

FIG. 3 shows semiconductor device 50 having a wafer substrate 51 provided with a tight pitch array 52 of redundancy activation fuses. Array 52 includes a plurality (bank) of unilateral individual connector terminals 53 disposed in closely adjacent side by side arrangement, and connected at their distal ends 53a to a circuit portion (not shown) and at their medial ends 53b to a corresponding plurality of fuse links 54. A single common connector terminal 55 is disposed as a common pad or bus in opposing, crosswise relation to individual connector terminals 53, and is connected at distal portion 55a to another circuit portion (not shown) and at and along medial portion 55b to the adjacent bank of fuse links 54. Fuse links 54 interconnect individual connector terminals 53 and common connector terminal 55 at connection points 56 and 57, and provide fuse pitch interval 58.

Figure 4:
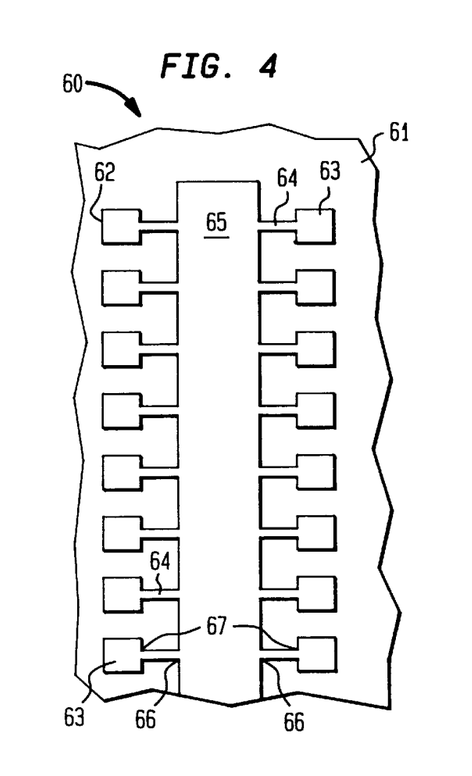
FIGS. 4 and 5 are top views on a reduced scale of portions, respectively, of two further modified electrical fuse arrangements similar to that shown in FIG. 2.

Semiconductor device 50 of FIG. 3 only differs from semiconductor device 40 of FIG. 4 in that, e.g., bilateral, notched (indented) portions 59 are provided at connection points 57 to promote even more the differential resistance heating between fuse links 54 and common connector terminal 55 and especially local preferential accelerated melting at notched portions 59.

While the matter is not fully understood at this time, it is believed that notched portions 59 disrupt the local flow of electrons to promote high current densities, as the awkward, non-uniform shape involved is considered to enhance the desired local increase in current density, thereby promoting accelerated local melting of the pertinent fuse link at minimized operating power.

Referring now to FIG. 4, there is shown a modified bilateral arrangement of electrical fuses according to the invention, similar to the arrangement shown in FIG. 2. FIG. 4 includes semiconductor device 60, wafer substrate 61, fuse array 62, individual connector terminals 63, fuse links 64, common connector terminal 65, and connection points 66 and 67.

FIG. 4 shows semiconductor device 60 having a wafer substrate 61 provided with a tight pitch bilateral array 62 of fuses of the type shown in FIG. 2. Array 62 includes two opposed sets (banks) of fuses, each with a plurality of individual connector terminals 63 disposed in closely adjacent side by side arrangement and connected to a corresponding plurality of fuse links 64. A single common connector terminal 65 is disposed as a common pad or bus in opposing, crosswise relation to individual connector terminals 63, and is connected at and along both sides of its lateral extent to the adjacent fuse links 64. Fuse links 64 interconnect individual connector terminals 63 and common connector terminal 65 at connection points 66 and 67.

Semiconductor device 60 of FIG. 4 only differs from semiconductor device 40 of FIG. 2 in that the fuse links 64 and individual connector terminals 63 are provided on both running sides of common connector terminal 65.

Figure 5:
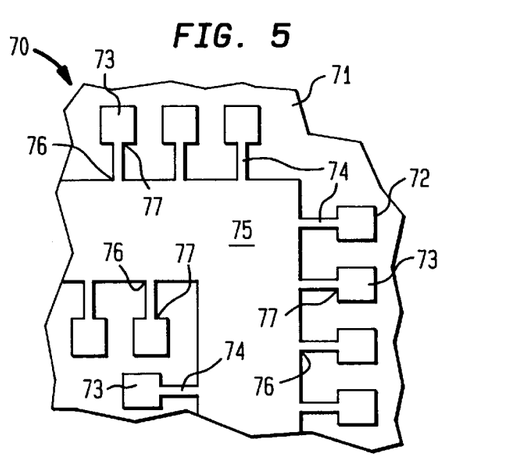

Referring now to FIG. 5, there is shown another modified bilateral arrangement of electrical fuses according to the invention, similar to the arrangement shown in FIG. 2. FIG. 5 includes semiconductor device 70, wafer substrate 71, fuse array 72, individual connector terminals 73, fuse links 74, common connector terminal 75, and connection points 76 and 77.

FIG. 5 shows semiconductor device 70 having a wafer substrate 71 provided with a tight pitch bilateral and angular array 72 of fuses of the type shown in FIG. 4. Array 72 includes two opposed sets (banks) of fuses in angular disposition, each with a plurality of individual connector terminals 73 disposed in closely adjacent side by side arrangement and connected to a corresponding plurality of fuse links 74. A single common connector terminal 75 of angular shape is disposed as a common pad or bus in opposing, crosswise relation to individual connector terminals 73, and is connected at and along both sides of its angular lateral extent to the adjacent fuse links 74. Fuse links 74 interconnect individual connector terminals 73 and common connector terminal 75 at connection points 76 and 77.

Semiconductor device 70 of FIG. 5 only differs from semiconductor device 60 of FIG. 4 in that the fuse links 74 and individual connector terminals 73 are provided on both running sides of angularly shaped common connector terminal 75.

Figure 6:
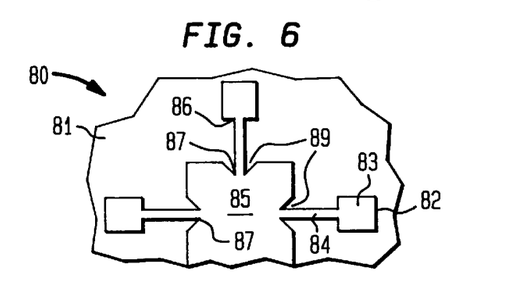
FIG. 6 is a top view on a reduced scale of a portion of a still further modified electrical fuse arrangement similar to that shown in FIG. 3.

Referring now to FIG. 6, there is shown a further modified arrangement of electrical fuses according to the invention, similar to the arrangement shown in FIG. 3. FIG. 6 includes semiconductor device 80, wafer substrate 81, fuse array 82, individual connector terminals 83, fuse links 84, common connector terminal 85, connection points 86 and 87, and notched portions 89.

FIG. 6 shows semiconductor device 80 having a wafer substrate 81 provided with a tight pitch three sided array 82 of fuses of the type shown in FIG. 3. Array 82 includes a plurality of individual connector terminals 83 in closely adjacent arrangement, each connected to a fuse link 84 which in turn is connected to a single common connector terminal 85, i.e., around and along three of its sides, thus permitting efficient use of an oddly shaped available substrate area by array 82. Fuse links 84 interconnect individual connector terminals 83 and common connector terminal 85 at connection points 86 and 87. Common connector terminal 85 is provided with, e.g., bilateral, notched (indented) portions 89 similar to notched portions 59 of FIG. 3 and for the same purpose.

Of course, all of the embodiments of the invention can include such notched portions at the common connector terminal connection points with the fuse links for the desired purpose.

Figure 7:
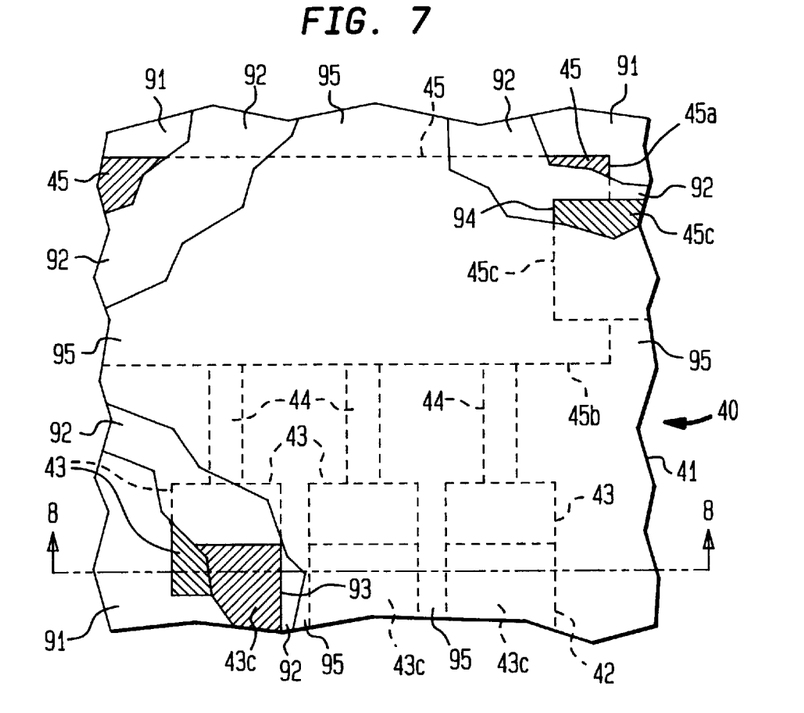
FIG. 7 is an enlarged top view of a portion of the arrangement shown in FIG. 2, encapsulated between insulation layers and containing electrical contacts, being partially broken away to illustrate particular details.
Figure 8:
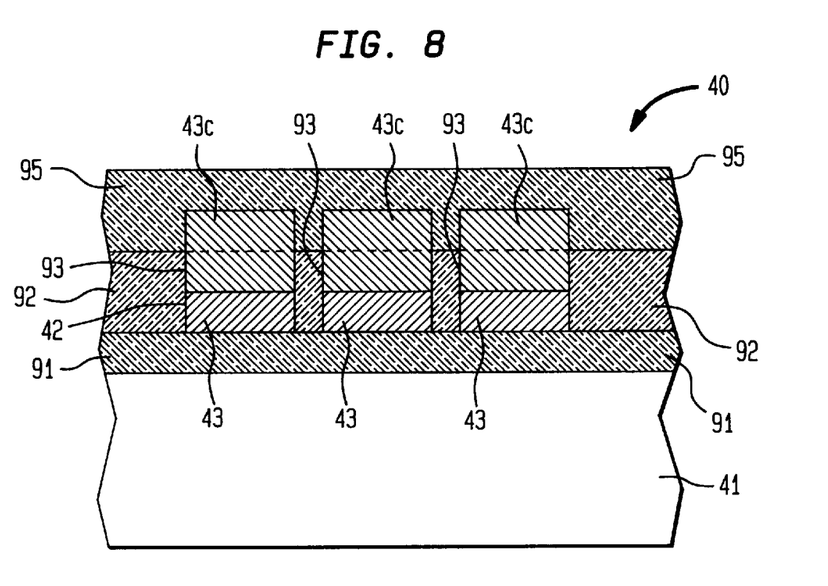
FIG. 8 is a vertical sectional view, taken along a dashed line 8—8 of FIG. 7.

Referring now to FIGS. 7 and 8, there is shown a top view (FIG. 7), and a cross-sectional view (FIG. 8) through a dashed line 8—8 of FIG. 7, of a portion of the arrangement of FIG. 2, encapsulated between insulation layers and containing electrical contacts. FIGS. 7 and 8 variously include semiconductor device 40, wafer substrate 41, fuse array 42, individual connector terminals 43, electrical contacts 43c, fuse links 44, common connector terminal 45, distal portion 45a, medial portion 45b, electrical contact 45c, first and second insulation layers 91 and 92, contact openings 93 and 94, and third insulation layer 95.

FIGS. 7 and 8 show a portion of semiconductor device 40 with wafer substrate 41, e.g., of silicon, having fuse array 42, e.g., formed from a deposited layer of polysilicon, and including individual connector terminals 43 connected to fuse links 44 in turn connected to common connector terminal 45, in encapsulated condition.

More specifically, a first insulation layer 91 of suitable dielectric material, such as silicon dioxide, is deposited on wafer substrate 41, and then the layer of fuse forming material, e.g., of polysilicon, is deposited on first insulation layer 91 to form fuse array 42, such as by photolithographic masking and etching technique. Thereafter, a second insulation layer 92 of such dielectric material is deposited onto first insulation layer 91 and in covering relation over fuse array 42 sufficiently to encapsulate fuse array 42 between first and second insulation layers 91 and 92.

Second insulation layer 92 is next provided with individual contact openings 93 aligned to expose corresponding underlying portions of individual connector terminals 43. Second insulation layer 92 is also provided, e.g., in the vicinity of distal portion 45a and more or less remote from medial portion 45b, with a common contact opening 94 to expose the underlying portion of common connector terminal 45. Then, individual electrical contacts 43c are deposited in individual contact openings 93 in conductive contact with the corresponding individual connector terminals 43, and common electrical contact 45c is deposited in common contact opening 94 in conductive contact with common connector terminal 45. Finally, a third insulation layer 95 is deposited onto second insulation layer 92 to enclose protectively and isolate fuse array 42 on wafer substrate 41.

Electrical contacts 43c and 45c are formed of suitable electrically conductive material, such as a metal, e.g., aluminum, and are provided to connect the fuses of fuse array 42 into particular circuits as desired. Thus, individual electrical contacts 43c connect corresponding individual connector terminals 43 to one portion of a given circuit arrangement, while common electrical contact 45c connects common connector terminal 45 to another portion thereof in conventional manner.

Like fuse array 42, first, second and third insulation layers 91, 92 and 95, as well as electrical contacts 43c and 45c, are deposited, by conventional technique, e.g., by CVD or PECVD, as desired. Contact openings 93 and 94 are also provided by conventional technique, such as by photolithographic masking and etching operations.

Figure 9:
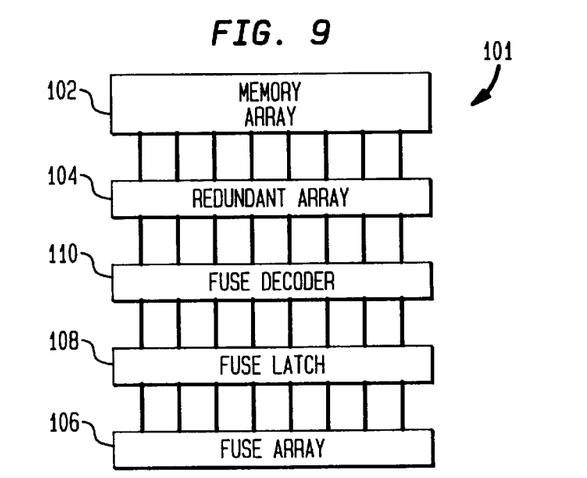
FIG. 9 is a schematic block diagram of a dynamic random access memory (DRAM) integrated circuit embodying an electrical fuse arrangement according to the invention.

Referring now to FIG. 9, there is shown a dynamic random access memory (DRAM) integrated circuit, for example, embodying the electrical fuse arrangement of FIG. 2. FIG. 9 includes DRAM circuit 101, main memory array 102, redundant array 104, fuse array 106, fuse latch array 108, and fuse decoder circuit 110.

FIG. 9 shows a typical DRAM integrated circuit including main memory array 102 having redundant array 104 to facilitate replacement of a defective main array element within main memory array 102. For this purpose, a plurality of fuses, such as those in the arrangement shown in FIG. 2, are provided in fuse array 106 coupled to redundant array 104 via fuse latch array 108 and fuse decoder circuit 110. To replace a defective main. memory array element, individual fuses in fuse array 106 can be blown to set their values to either a "1" or a "0" as required by decoder circuit 110 in accordance with conventional technique.

During operation, the values of the fuses in fuse array 106 are loaded into fuse latch array 108 upon power up of the IC. These values are then decoded by fuse decoder circuit 110 during run time, to facilitate replacement of specific failed main memory array elements with specific redundant elements of redundant array 104. Techniques for replacing failed main memory array elements with redundant array elements are well known in the art. However, according to the invention, fuse array 106 is advantageously provided with a fuse arrangement of tight pitch, such as that of FIG. 2, for conserving wafer substrate space and more densely packing circuit components on the microchip.

The fuse links, individual connector terminals and common connector terminal are deposited on the wafer substrate by conventional technique in horizontal or lateral layer form in a suitable layer thickness, such as about 0.1–1.5 micron (1,000–15,000 angstroms), e.g., about 0.3 micron (3,000 angstroms). Typically, the fuse links are about 4 microns in length and about 0.2 micron (2,000 angstroms) in width (such as width 48a of FIG. 2), the individual connector terminals are about 1 micron or more in length and about 1 micron (10,000 angstroms) or more in width (such as width 48b of FIG. 2), and the common connector terminal is about 2 microns or more in length, i.e., in the longitudinal direction of the pertinent fuse link, and about 2 microns or more in width (such as width 48c of FIG. 2).

For example, at a fuse link width of 0.2 micron and associated common connector terminal width of 2 microns, both at a 0.3 micron (layer) thickness, the common connector terminal cross sectional area of 0.6 square micron is 10 times the 0.06 square micron fuse link cross sectional area. Also, at an individual connector terminal width of 1 micron and (layer) thickness of 0.3 micron, the 0.6 square micron common connector terminal cross sectional area is 2 times the 0.3 square micron individual connector terminal cross sectional area.

At such dimensions, a given fuse link, e.g., of the type shown in FIG. 2, can be blown with an input current density of typically about $10^6$ to $10^8$ amps/cm$^2$ in the fuse link, using a current of typically about 1 to 50 mA with the current density in the large connector being about $10^5$ to $10^6$ amps/cm$^2$.

The fusing voltage usable for the fuses of the invention is usually about 1–10 volts, typically about 5 volts, but may be as low as about 0.5 volts. For example, when the fuse link is of polysilicon or metal silicide, the fusing voltage is about 2–6 volts, and when it is of metal, e.g., aluminum or copper, it is about 0.5–3 volts, or 1–3 volts.

Fusing voltages below about 10 volts are possible because the common connector terminal has a cross sectional area of about 2 or more times, preferably about 10 or more times, that of the fuse links, without compromising the desired fuse pitch reduction or minimized fuse pitch attainable in practice. The fuse pitch is not compromised since the common connector terminal acts as a common large bus or electrode to ground the adjacent end of the fuse links such that the reduction in cross section from the common large bus to the fuse links is always large, preferably greater than a 2-fold, and especially a 10-fold, reduction, yet the fuse pitch is not adversely affected.

The common connector terminal is typically held at a less positive potential than one of the individual connector terminals during the time a fuse link threat is to be opened such that electron flow is in a direction from the common connector terminal to the fuse link.

In the past, semiconductor fabrication was effected with defective memory elements or other circuit components being replaced by redundant elements on testing at the wafer substrate level, using a laser to cut the fuse or overcurrent to blow the fuse to activate redundant elements. The substrate then underwent after-steps, e.g., dice, pick, sort, packaging, and burn-in, before final testing. However, these after-steps added more stress to the chip which often introduced defects that could not be fixed at that point, rendering the chip defective.

In high volume, low margin products like DRAM ICs, any means of avoiding this problem is desirable. Current blown electrical fuses of sub-micron fuse pitch dimensions offer a convenient means to activate redundancy circuits at the module level, after all packaging and general testing are complete. Per the invention, this can be achieved efficiently at low fusing voltages of 10 volts or less with a fuse arrangement that does not compromise desired pitch reduction and so does not require too much real estate to implement.

Accordingly, it can be appreciated that the specific embodiments described are merely illustrative of the general principles of the invention. Various modifications may be provided consistent with the principles set forth.

What is claimed is:

1. A semiconductor device comprising: a substrate having on a surface thereof an array of fuses including a plurality of fuse links of selective cross sectional area in closely adjacent arrangement, each being connected at one end thereof to an individual connector terminal of larger cross sectional area than that of the fuse link, and being connected at another end thereof to a common connector terminal of larger cross sectional area than that of the individual connector terminals.

2. The semiconductor device of claim 1 wherein the cross sectional area of the common connector terminal is at least about 2 times that of the individual fuse links for enabling electrical fusing at voltages of at most about 10 volts.

3. The semiconductor device of claim 1 wherein the common connector terminal is held at a less positive potential than one of the individual connector terminals during the time a fuse link thereat is to be opened such that electron flow is in a direction from the common connector terminal to the fuse link.

4. The semiconductor device of claim 1 wherein the common connector terminal is locally notched at the point of connection of each fuse link thereto.

5. The semiconductor device of claim 1 further comprising a plurality of layers of insulation material such that the array of fuses is encapsulated between two layers of insulation material of the plurality of layers of insulation material, one of the two layers being disposed in underlying relation to the array of fuses and the other of the two layers being disposed in overlying relation to the array of fuses, and electrical contacts formed in respective openings of the layer of insulation material in overlying relation to the array of fuses, which openings correspondingly expose portions of the individual connector terminals and common connector terminal.

6. The semiconductor device of claim 1 wherein the fuse links have a cross sectional area of about 0.02–0.3 square micron, the individual connector terminals have a cross sectional area of about 0.1–1.5 square microns, and the common connector terminal has a cross sectional area of about 0.2–3 square microns.

7. A semiconductor device comprising: a substrate having on a surface thereof a bank of electrical fuses in an array for redundancy activation wiring or custom wiring, including a plurality of fuse links each connected at one end thereof to an individual connector terminal of larger cross sectional area than that of the fuse link and at another end thereof to a common connector terminal of larger cross sectional area than that of the individual connector terminals to promote maximized differential resistance heating between the common connector terminal and each corresponding fuse link and maximized preferential melting of each said fuse link, the common connector terminal being held at a less positive potential than one of the individual connector terminals during the time a fuse link thereat is to be opened such that electron flow is in a direction from the common connector terminal to the fuse link.

8. The semiconductor device of claim 7 wherein the cross sectional area of the common connector terminal is at least about 2 times that of the individual fuse links for enabling electrical fusing at voltages of at most about 10 volts.

9. The semiconductor device of claim 7 wherein the common connector terminal is locally notched at the point of connection of each fuse link thereto.

10. The semiconductor device of claim 7 further comprising a plurality of layers of insulation material such that the array of fuses is encapsulated between two layers of insulation material of the plurality of layers of insulation material, one of the two layers being disposed in underlying relation to the array of fuses and the other of the two layers being disposed in overlying relation to the array of fuses, and electrical contacts formed in respective openings of the layer of insulation material in overlying relation to the array of fuses, which openings correspondingly expose portions of the individual connector terminals and common connector terminal.

11. The semiconductor device of claim 7 wherein the fuse links have a cross sectional area of about 0.02–0.3 square micron, the individual connector terminals have a cross sectional area of about 0.1–1.5 square microns, and the common connector terminal has a cross sectional area of about 0.2–3 square microns.

12. A semiconductor device comprising a substrate having on a surface thereof an array of redundancy activation wiring and/or custom wiring fuses comprising:

a plurality of individual connector terminals of selective cross sectional area, each extending longitudinally from a distal end thereof to a medial end thereof and being in closely adjacent side by side arrangement;

a fuse link extending from the medial end of each individual connector terminal and being of smaller cross sectional area than that of the individual connector terminals; and a common connector terminal of larger cross sectional area than that of each individual connector terminal to promote maximized differential resistance heating between the common connector terminal and each corresponding fuse link and maximized preferential melting of each said fuse link, the common connector terminal extending crosswise of the side by side arrangement of the individual connector terminals and being connected along its length to each adjacent fuse link;

the cross sectional area of the common connector terminal being at least about 2 times that of the individual fuse links; and the common connector terminal being arranged for connection at a less positive potential than one of the individual connector terminals during the time a fuse link thereat is to be opened such that electron flow is in a direction from the common connector terminal to the fuse link.

13. The semiconductor device of claim 12 wherein the common connector terminal is locally notched at the point of connection of each fuse link thereto.

14. The semiconductor device of claim 12 further comprising a plurality of layers of insulation material such that the array of fuses is encapsulated between two layers of insulation material of the plurality of layers of insulation material, one of the two layers being disposed in underlying relation to the array of fuses and the other of the two layers being disposed in overlying relation to the array of fuses, and electrical contacts formed in respective openings of the layer of insulation material in overlying relation to the array of fuses, which openings correspondingly expose portions of the individual connector terminals and common connector terminal.

15. The semiconductor device of claim 12 wherein the fuse links have a cross sectional area of about 0.02–0.3 square micron, the individual connector terminals have a cross sectional area of about 0.1–1.5 square microns, and the common connector terminal has a cross sectional area of about 0.2–3 square microns.

16. An array of fuses on a surface of a substrate of a semiconductor device including a plurality of fuse links of selective cross sectional area in closely adjacent arrangement, each being connected at one end thereof to an individual connector terminal of larger cross sectional area than that of the fuse link, and being connected at another end thereof to a common connector terminal of larger cross sectional area than that of the individual connector terminals.

17. The array of fuses of claim 16 wherein the fuse links have a cross sectional area of about 0.02–0.3 square micron, the individual connector terminals have a cross sectional area of about 0.1–1.5 square microns, and the common connector terminal has a cross sectional area of about 0.2–3 square microns.

* * * * *